(12) United States Patent
Tsai et al.

(10) Patent No.: US 10,971,508 B2
(45) Date of Patent: Apr. 6, 2021

(54) INTEGRATED CIRCUIT AND METHOD OF MANUFACTURING THE SAME

(71) Applicant: Winbond Electronics Corp., Taichung (TW)

(72) Inventors: Yao-Ting Tsai, Taichung (TW); Che-Fu Chuang, Taichung (TW); Jung-Ho Chang, Taichung (TW); Hsiu-Han Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 3 days.

(21) Appl. No.: 16/391,326

(22) Filed: Apr. 23, 2019

(65) Prior Publication Data
US 2020/0343256 A1 Oct. 29, 2020

(51) Int. Cl.
*H01L 27/11531* (2017.01)
*H01L 27/11521* (2017.01)
(Continued)

(52) U.S. Cl.
CPC .. *H01L 27/11531* (2013.01); *H01L 21/28052* (2013.01); *H01L 21/28518* (2013.01); *H01L 21/31055* (2013.01); *H01L 27/11521* (2013.01); *H01L 29/40114* (2019.08); *H01L 29/45* (2013.01); *H01L 29/4933* (2013.01); *H01L 29/665* (2013.01); *H01L 29/66492* (2013.01);
(Continued)

(58) Field of Classification Search
CPC ......... H01L 27/11531; H01L 29/40114; H01L 21/31055; H01L 29/7883; H01L 21/28052; H01L 29/66515; H01L 29/4933; H01L 29/45; H01L 29/66825; H01L 29/665; H01L 21/28518; H01L 29/7833; H01L 27/11521; H01L 29/66492
USPC ......................................................... 257/321
See application file for complete search history.

(56) References Cited

U.S. PATENT DOCUMENTS 10,236,301 B1    3/2019 Howder et al.
2009/0186471 A1*  7/2009 Jung ............... H01L 21/823814
                                          438/527
(Continued)

FOREIGN PATENT DOCUMENTS

CN    104282630    5/2017
CN    109427803    3/2019
(Continued)

OTHER PUBLICATIONS

"Office Action of Taiwan Counterpart Application," dated Sep. 11, 2019, p. 1-p. 6.

*Primary Examiner* — Karen Kusumakar
*Assistant Examiner* — Adam S Bowen
(74) *Attorney, Agent, or Firm* — JCIPRNET

(57) ABSTRACT

Provided is an integrated circuit including a substrate, a plurality of first gate structures, a protective layer, a second gate structure, a source region, and a drain region. The substrate has a cell region and a peripheral region. The plurality of first gate structures are disposed in the cell region. A top surface and a sidewall of the plurality of first gate structures are covered by the protective layer. The second gate structure is disposed in the peripheral region. The source region and the drain region are disposed on the both side of the second gate structure. A manufacturing method of the integrated circuit is also provided.

16 Claims, 18 Drawing Sheets

(51) Int. Cl.
*H01L 21/28* (2006.01)
*H01L 21/285* (2006.01)
*H01L 21/3105* (2006.01)
*H01L 29/788* (2006.01)
*H01L 29/66* (2006.01)
*H01L 29/49* (2006.01)
*H01L 29/45* (2006.01)
*H01L 29/78* (2006.01)

(52) U.S. Cl.
CPC .. *H01L 29/66515* (2013.01); *H01L 29/66825* (2013.01); *H01L 29/7833* (2013.01); *H01L 29/7883* (2013.01)

(56) References Cited

U.S. PATENT DOCUMENTS

2016/0307906 A1* 10/2016 Kim .................. H01L 27/10876
2019/0081069 A1    3/2019 Lu et al.
2019/0363093 A1* 11/2019 Chen .................... H01L 21/266

FOREIGN PATENT DOCUMENTS

| | | |
|---|---|---|
| CN | 109496358 | 3/2019 |
| JP | 2019041061 | 3/2019 |
| TW | I451533 | 9/2014 |
| TW | 201826507 | 7/2018 |
| TW | 201830671 | 8/2018 |
| TW | 201843818 | 12/2018 |
| WO | 2019022814 | 1/2019 |

\* cited by examiner

INTEGRATED CIRCUIT AND METHOD OF
MANUFACTURING THE SAME

BACKGROUND

Technical Field

The present invention relates to an integrated circuit and a method of fabricating the same, and more particularly to an integrated circuit that may be effectively reduced in size and a method of fabricating the same.

Description of Related Art

With the rapid development of technology, semiconductor devices are integrated into the peripheral region to reduce the cost and simplify the process steps, thereby reducing the size of the integrated region. This technology has gradually become a trend.

However, in the case of a flash memory, since a flash memory system is mostly a high-temperature process, and a device having a small size (such as a logic device) needs to use a low-temperature process. Therefore, if the logical device is to be integrated into the peripheral region of the flash memory, the source region and the drain region of the logical device may be affected by the high-temperature process of the flash memory to cause undesired diffusion. As a result, the size of the device located in the peripheral region cannot be effectively controlled. Therefore, how to provide an integrated circuit and a manufacturing method thereof may effectively control the device size of the integrated region of the integrated circuit, which will become an important issue.

SUMMARY

The embodiment of the invention provides an integrated circuit and a manufacturing method thereof, which may effectively control the device size of the peripheral region of the integrated circuit, thereby reducing the device size of the peripheral region of the integrated circuit.

The embodiment of present invention provides a method of manufacturing an integrated circuit, the steps of which are as follows. A substitute is provided. The substrate has a cell region and a peripheral region. The first process is performed on the substrate. The first process includes forming a plurality of first gate structures in the cell region, and forming a gate dielectric material layer and a conductive layer in the peripheral region. A protective layer is conformally formed on the plurality of first gate structures. After the first process, the second process is performed. The second process includes patterning the dielectric material layer and the conductive layer in the peripheral region to form a second gate structure. The source region is formed on the first side of the second gate structure. A source region and a drain region are formed on both sides of the second gate structure.

The embodiment of present invention provides an integrated circuit including a substrate, a plurality of first gate structures, a conformal protective layer, a second gate structure, a source region, and a drain region. The substrate has a cell region and a peripheral region. The plurality of first gate structures are disposed in the cell region. A conformal protective layer covers the top surface and sidewall of each first gate structure. The second gate structure is disposed in the peripheral region. The source region and the drain region are configured in the substrate on both sides of the second gate structure.

Based on the above, the protective layer is conformally formed on the first gate structures, and covers the top surface and the sidewall of the first gate structure, so that the protective layer can protect the first gate structure from being interfered by the mobile ions, prevent the mobile ions from diffusing into the first the gate structures, and avoid the device from being damaged. In addition, in the present invention, since the first process has completed most of the high temperature process, the diffusion of the source region and the drain region may be more effectively controlled when the device in the peripheral region is made, and the device in the peripheral region may be controlled to a smaller gate length. Therefore, the device size of the peripheral region in the integrated circuit may be reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
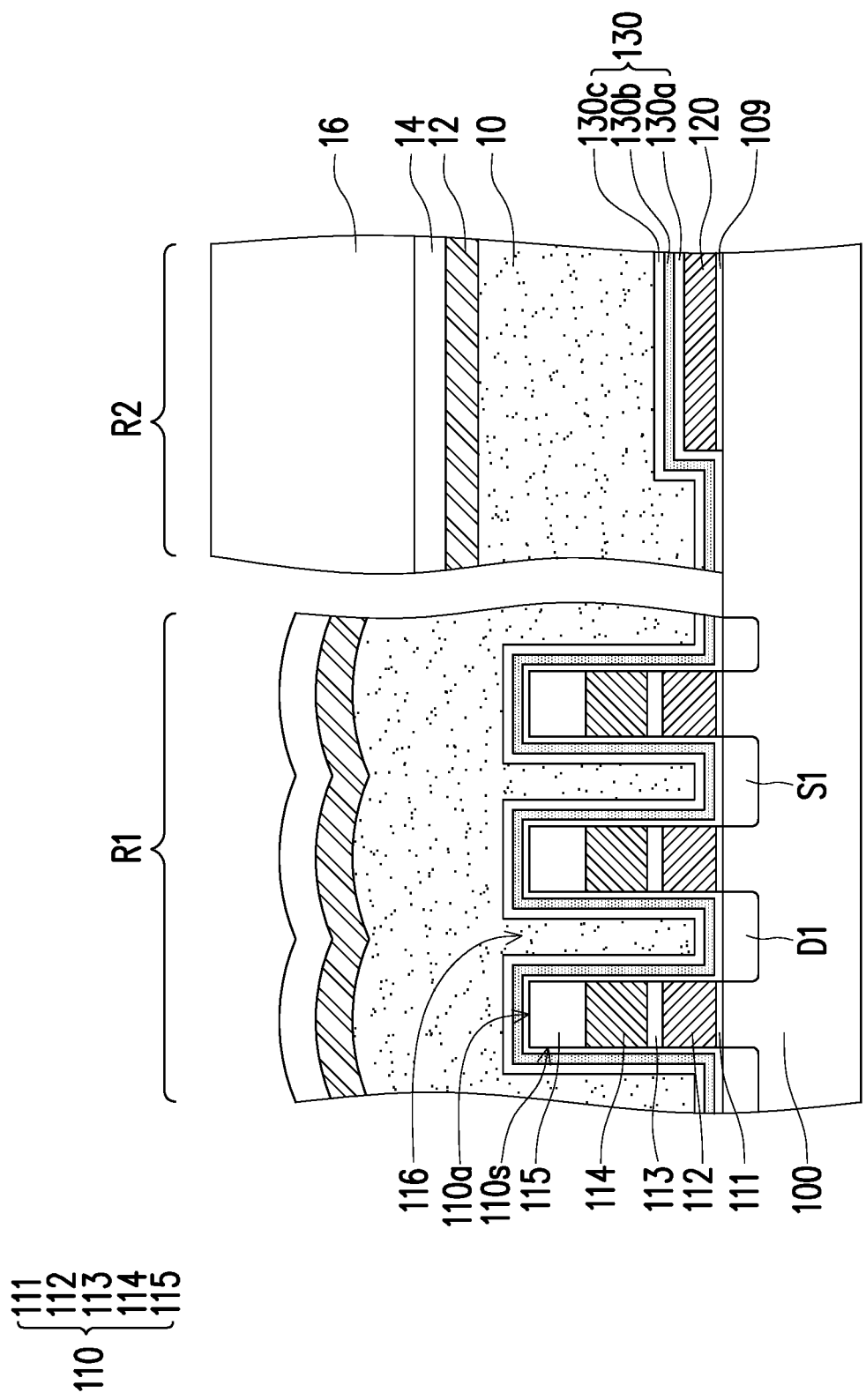
FIGS. 1A through 1Q are schematic cross-sectional views showing a manufacturing process of an integrated circuit in accordance with an embodiment of the present invention.

The invention will be more fully described with reference to the drawings of the embodiments. The invention will be more fully described with reference to the drawings of the embodiments. However, the invention may also be implemented in a variety of different forms and should not be limited to the embodiments described herein. The thickness of layers and regions in the drawings will be exaggerated for clarity. The thickness of layers and regions in the drawings will be exaggerated for clarity.

Referring to FIG. 1A, the embodiment provides a method for manufacturing an integrated circuit, and the steps are as follows. A substrate 100 is provided, and the substrate 100 is, for example, silicon substrate. The substrate 100 has a cell region R1 and a peripheral region R2.

A first process is performed on the substrate 100. The first process is, for example, a flash memory process, but the invention is not limited thereto. The first process may include the following steps. First, a plurality of first gate structures 110 are formed on the substrate 100 in the cell region R1, and a gate dielectric material layer 109 and a conductive layer 120 are formed on the substrate 100 in the peripheral region R2.

In detail, in the cell region R1, the first gate structure 110 includes, for example, a tunneling dielectric layer 111, a conductive layer 112, a inter-gate dielectric layer 113, a conductive layer 114, and a top cap layer 115 which are sequentially stacked on the substrate 100. The material of the tunneling dielectric layer 111 is, for example, silicon oxide. The conductive layer 112 may serve as a floating gate, and a material of conductive layer 112 is, for example, doped polysilicon. The inter-gate dielectric layer 113 is, for example, a composite layer of silicon oxide, silicon nitride, and silicon oxide (ONO). The conductive layer 114 may serve as a control gate, and a material of the conductive layer 114 is, for example, doped polysilicon. A material of the top cap layer 115 may be a dielectric material such as silicon oxide. The conductive layer 114 and the top cap layer 115 may be strip structures extending along a direction perpendicular to the paper surface.

In an embodiment, in the cell region R1, the conductive layer 114 in the first gate structure 110 does not include a metal silicide layer and is in direct contact with the top cap layer 115, but the invention is not limited thereto. Since the metal silicide layer does not included in the conductive layer 114 of the first gate structure 110, the height of the first gate structure 110 of the embodiment of the present invention is small compared to the gate structure having the metal silicide layer. In an embodiment, the height of the first gate structure 110 is, for example, 350 nm.

The material of the gate dielectric material layer 109 may include silicon oxide, silicon oxynitride, and silicon nitride. Further, a multilayer material may also be used as the gate dielectric material layer 109. A material of the conductive layer 120 is, for example, doped polysilicon. The formation method of each of the above layers is, for example, chemical vapor deposition (CVD) or thermal oxidation. Moreover, the present invention does not limit the order of formation the first gate structure 110 and the conductive layer 120. The gate dielectric material layer 109 and the conductive layer 120 may be formed together in any fabrication step of the first gate structure 110, depending on device design requirements. For example, a material of the gate dielectric material layer 109 may be the same as a material of the tunneling dielectric layer 111, and thus the gate dielectric material layer 109 and the tunneling dielectric layer 111 may be formed in the same deposition process. The conductive layer 120 may also be formed between the steps of forming the conductive layer 112 and the inter-gate dielectric layer 113 of the first gate structure 110.

Figure 2:
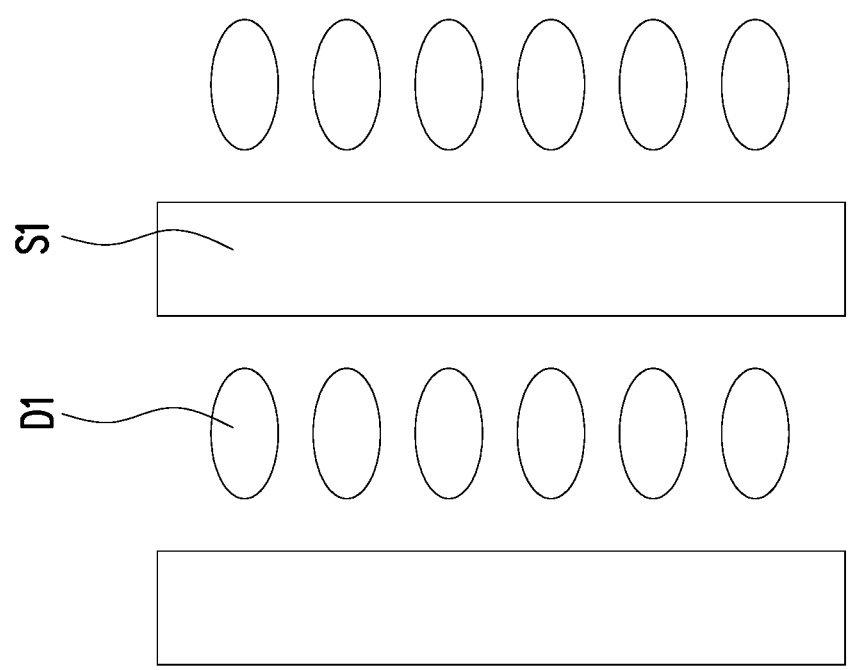
FIG. 2 is a top view of a source region and a drain region of a cell region of an integrated circuit according to an embodiment of the invention.

Referring to FIG. 1A and FIG. 2 simultaneously, the first gate structure 110 is omitted from FIG. 2 for clarity. The ion implantation process is performed on the substrate 100 in the cell region R1 to form a source region S1 and a drain region D1. Specifically, the source region S1 and the drain region D1 are formed on both sides of the first gate structure 110, respectively. In an embodiment, as shown in FIG. 2, the source region S1 may be a strip structure, and the drain region D1 may be a block structure sandwiched between two adjacent source regions S1. The source region S1 and the drain region D1 are, for example, N-type or P-type doped regions.

Referring to FIG. 1A, after the first gate structures 110 and the conductive layers 120 are formed, a protective layer 130 is blanketly formed on the substrate 100. Here, the blanket formation may be defined as a layer being simultaneously formed on the substrate 100 in the cell region R1 and the peripheral region R2. The protective layer 130 may be conformally formed on the first gate structures 110 and the conductive layer 120. The protective layer 130 is conformally formed on the first gate structure 110 in the cell region R1 and does not fill up the gap between the first gate structures 110, thus a first opening 116 is formed between the first gate structures 110. The protective layer 130 may cover a top surface 110a and sidewalls 110s of the first gate structure 110, and a surface of the substrate 100 adjacent to the first gate structure 110. The top surface 110a and the sidewall 110s of the first gate structure 110 are both covered by the protective layer 130, and the protective layer 130 can block moving ions. Therefore, the first gate structure 110 can be protected from or less from the interference of the mobile ion, and the mobile ions are prevented from diffusing into the first gate structure 110, thereby preventing the memory device from being damaged. The mobile ions described herein are, for example, Fe, Cu, Al, In, Co ions, and the like.

In some embodiments, the protective layer 130 may include a material different from the top cap layer 115. The protective layer 130 may include a dielectric material such as an oxide or a nitride, for example, silicon oxide or silicon nitride. The protective layer 130 may be a single layer or multiple layers. In this embodiment, the protective layer 130 may include protective layers 130a, 130b, 130c stacked on the first gate structure 110 in sequence. The protective layer 130a/protective layer 130b/protective layer 130c is, for example, a silicon oxide/silicon nitride/silicon oxide layer, and the formation method thereof includes a chemical vapor deposition method.

Next, after the protective layer 130 is formed, the conductive layer 10 is blanketly formed on the substrate 100. In the cell region R1, the conductive layer 10 is filled in the first opening 116 between the first gate structures 110 and overlaid on the protective layer 130. In the peripheral region R2, the conductive layer 10 covers the protective layer 130 on the substrate 100 and the conductive layer 120. The material of the conductive layer 10 is, for example, doped polysilicon, and the formation method thereof includes chemical vapor deposition. Since the height of the first gate structure 110 in the cell region R1 is different from the height of the conductive layer 120 in the peripheral region R2, the heights of the conductive layers 10 on the cell region R1 and the peripheral region R2, are also different. In this embodiment, the height of the conductive layer 10 in the cell region R1 is higher, and the height of the conductive layer 10 in the peripheral region R2 is lower.

Figure 1B:
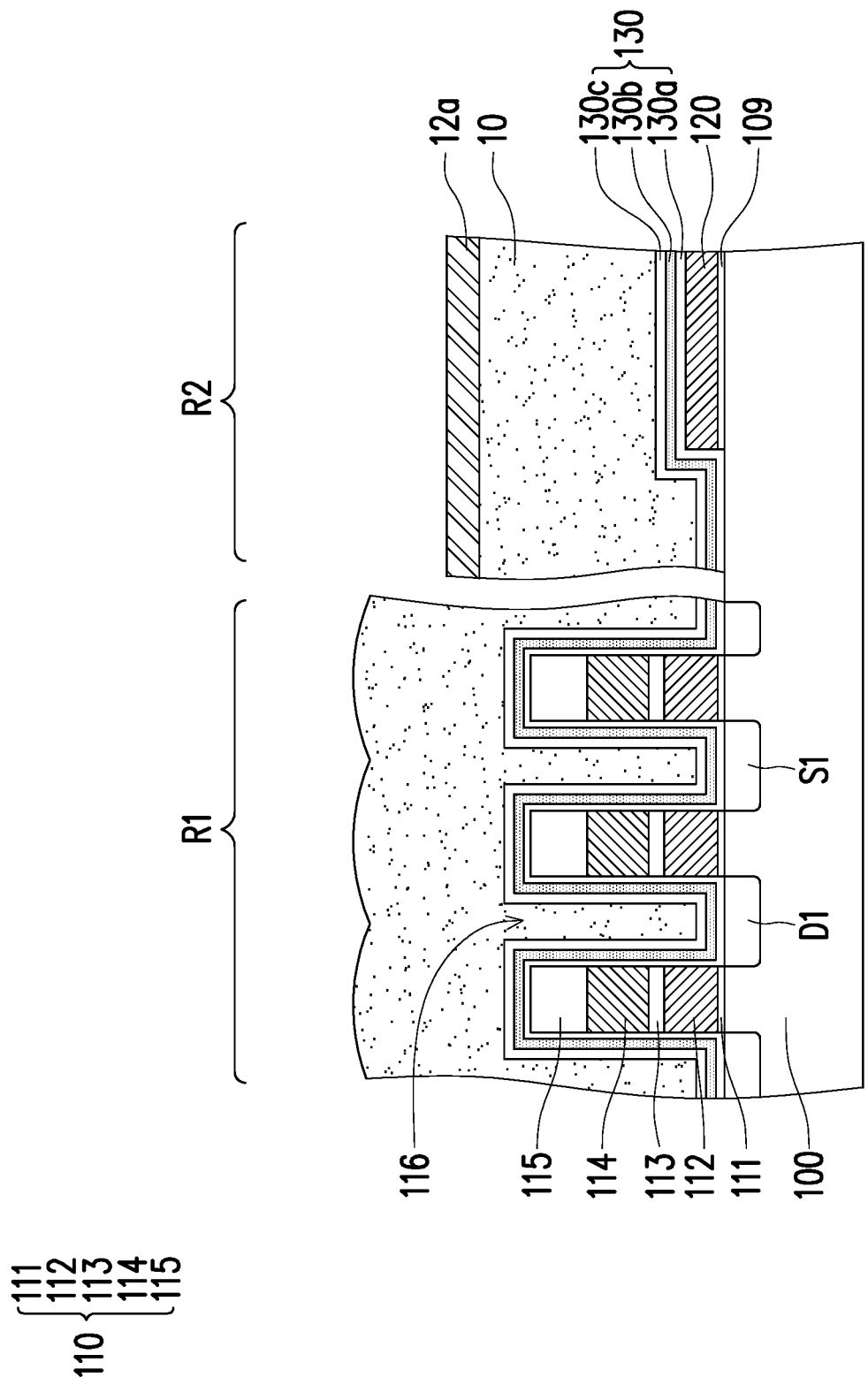

Referring to FIG. 1A and FIG. 1B, after the conductive layer 10 is formed, the stop layer 12 and the insulating layer 14 are blanketly formed on the substrate 100. The stop layer 12 and the insulating layer 14 may be respectively a dielectric layer, for example, silicon nitride or silicon oxide. The formation method of the stop layer 12 and the insulating layer 14 includes a chemical vapor deposition method. In an embodiment, the insulating layer 14 may not be formed, that is, only the stop layer 12 is formed. In an embodiment, the stop layer 12 and the conductive layer 10 have different materials. For example, a material of the stop layer 12 is silicon nitride, and a material of the conductive layer 10 is doped polysilicon. Next, a mask layer 16 is formed on the substrate 100. The mask layer 16 covers the insulating layer 14 in the peripheral region R2, and exposes the insulating layer 14 on the substrate 100 in the cell region R1. The mask layer 16 is, for example, a photoresist material. Thereafter, the insulating layer 14 is etched with the mask layer 16 as an etch mask to remove the insulating layer 14 on the substrate 100 in the cell region R1. The mask layer 16 is removed. Then, using the remaining insulating layer in the peripheral region R2 as an etching mask, the stop layer 12 is etched to remove the stop layer 12 in the cell region R1, and a stop layer 12a is formed in the peripheral region R2, and the conductive layer 10 on the substrate 100 in the cell region R1 is exposed. After that, the remaining insulating layer in the peripheral region R2 is removed. The above etching method may be a dry etching process or a wet etching process. The wet etching process is, for example, a wet dip etching. In the present embodiment, the height of the conductive layer 10 in the cell region R1 is high, and the surface of the conductive layer 10 is exposed, and the height of the conductive layer 10 in the peripheral region R2 is low, and the surface of the conductive layer 10 is covered by the stop layer 12a.

Figure 1C:
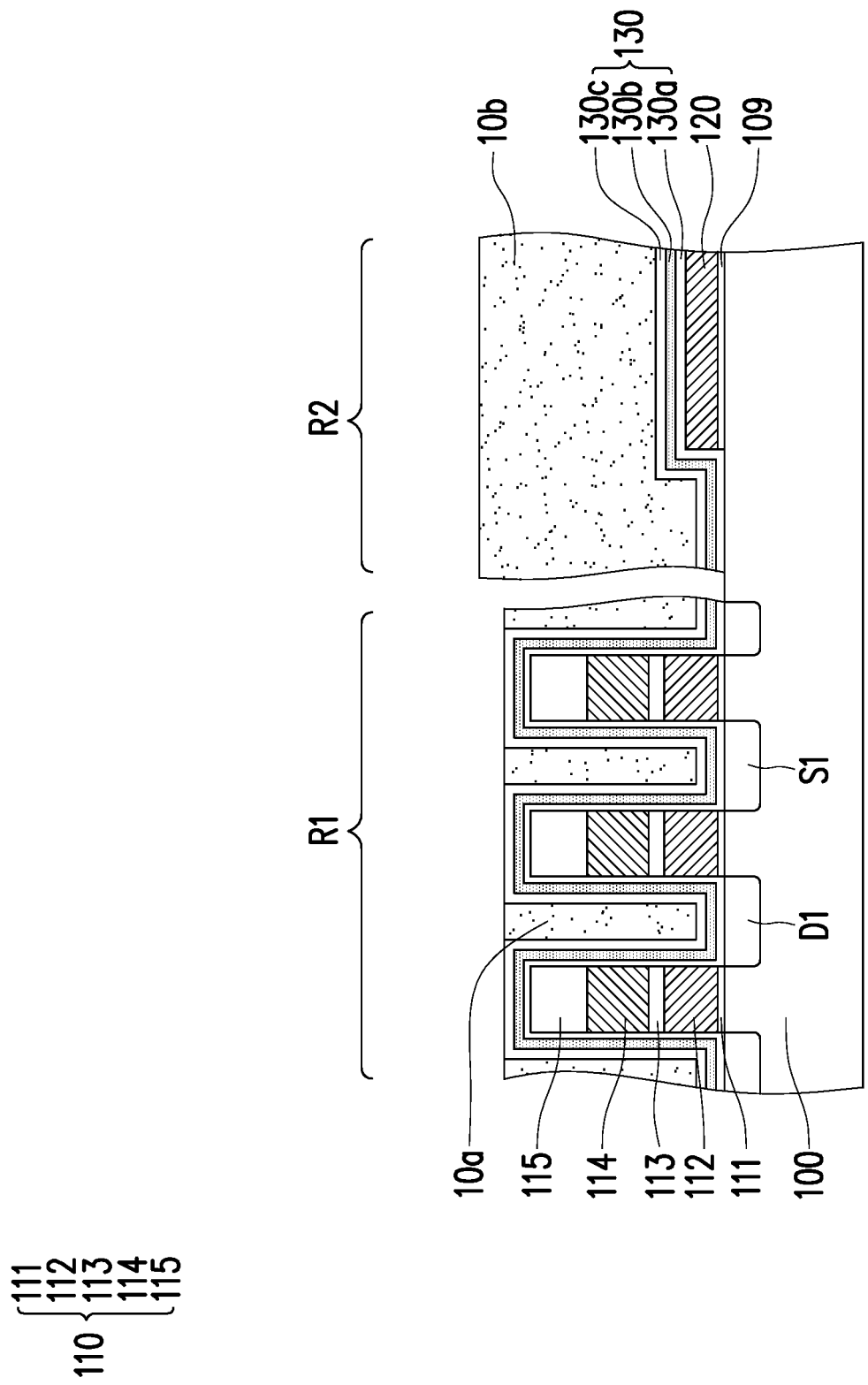

Referring to FIG. 1B and FIG. 1C, the conductive layer 10 is planarized by using the stop layer 12a as a stop layer. For example, a chemical-mechanical polishing (CMP) process is performed to leave a remaining conductive layer with a relatively flat surface. A plurality of dummy plugs 10a and a capping layer 10b are formed on the substrate 100. The dummy plug 10a is located in the first opening 116 in the cell region R1, and the capping layer 10b is located in the peripheral region R2 and covers the protective layer 130.

In the present embodiment, during the planarization process, a polishing rate of the stop layer 12a is lower than a polishing rate of the conductive layer 10. With the stop layer 12a formed in the peripheral region R2, the polished amount of the conductive layer under the stop layer 12a is reduced. Therefore, the height difference between the cell region R1 and the peripheral region R2 due to the loading effect can be decreased.

After the planarization step, in the cell region R1, a top surface of the dummy plug 10a may be coplanar with a top surface of the protective layer 130c, and a bottom surface of the capping layer 10b may be in contact with the top surface of the protective layer 130c. In some embodiments, the stop layer 12a is completely consumed in the planarization process, as shown in FIG. 1C. In other embodiments, the stop layer 12a is not completely consumed in the planarization process.

Figure 1D:
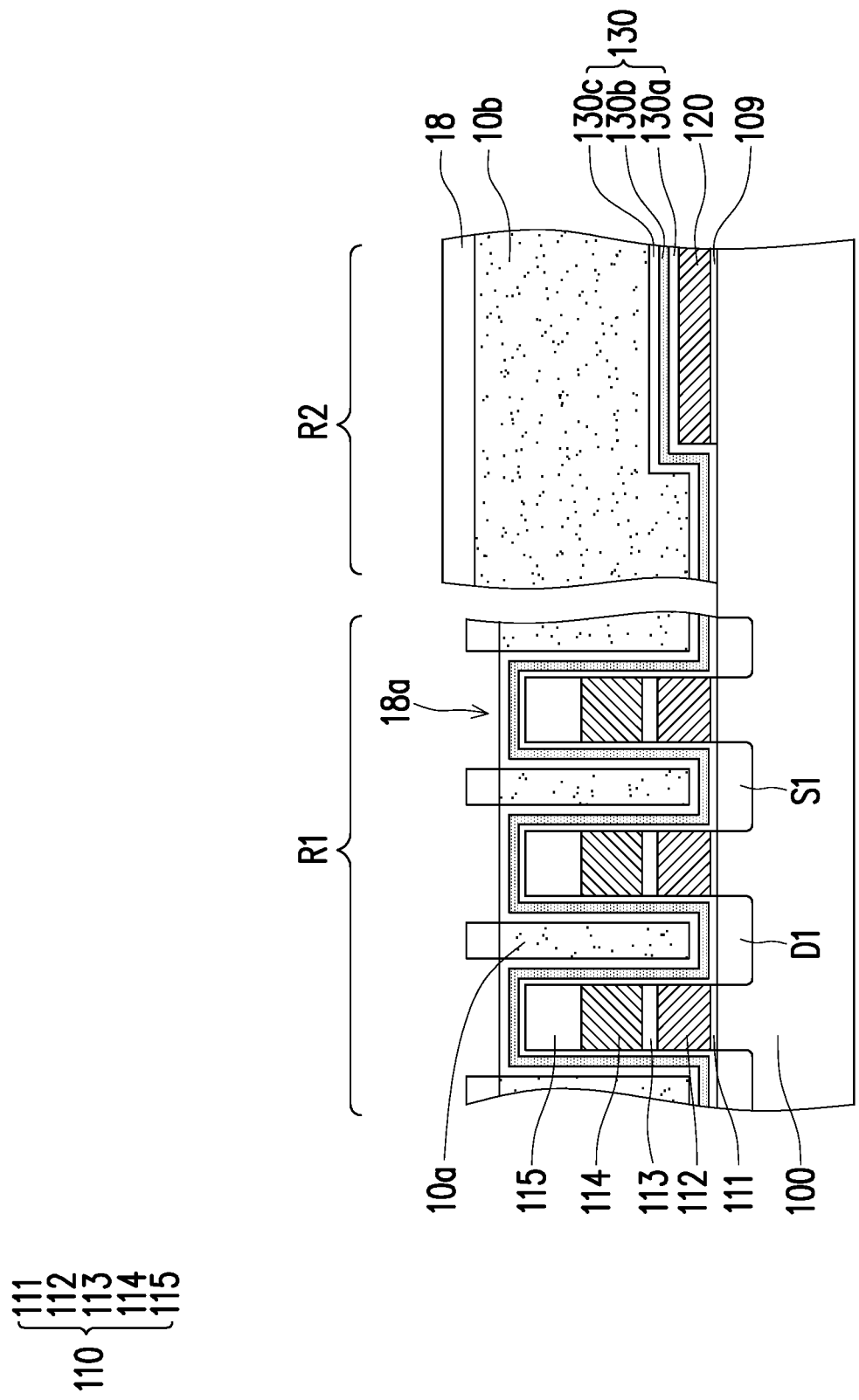

Referring to FIG. 1C and FIG. 1D, after the dummy plugs 10a and the capping layer 10b are formed, a stop layer 18 is formed on the substrate 100 in the cell region R1 and the peripheral region R2. The stop layer 18 covers the capping layer 10b, and a position of the stop layer 18 corresponds to a position where it is intended to form a contact plug. The stop layer 18 has an opening 18a that exposes the protective layer 130 on the first gate structure 110 in the cell region R1. In other words, the stop layer 18 exposes the protective layer 130 between two adjacent dummy plugs 10a. A material of the stop layer 18 is, for example, tantalum nitride. In some embodiments, the step of forming the stop layer 18 is as follows. A stop material layer (not shown) is blanketly formed on the substrate 100 to cover the protective layer 130 and the dummy plug 10a in the cell region R1 and the capping layer 10b in the peripheral region R2. Next, a carbon layer, an oxynitride layer, and a photoresist layer (not shown) are sequentially formed on the stop material layer. A lithography process is performed on the photoresist layer, and a dry etching process is performed on the oxynitride layer and the carbon layer. The dry etching process is, for example, reactive ion etching (ME).

Figure 1E:
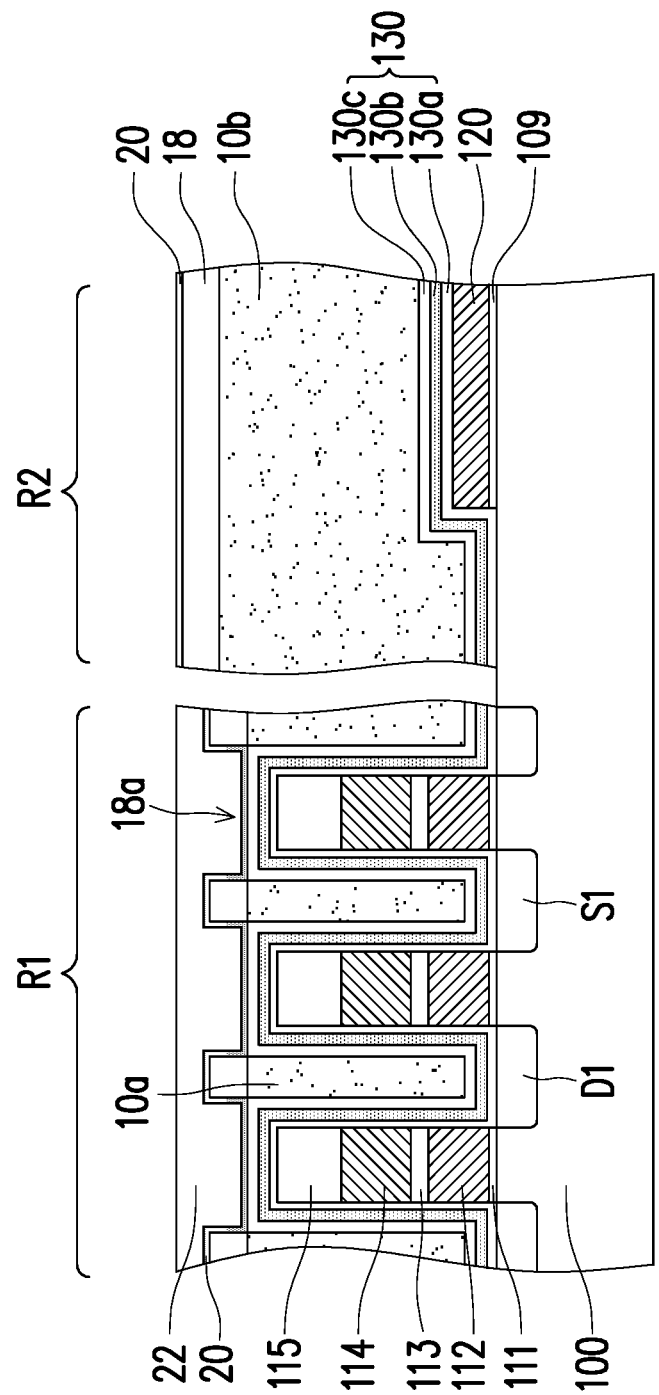

Referring to FIG. 1E, after the stop layer 18 is formed, a capping layer 20 is formed on the substrate 100 in the cell region R1 and the peripheral region R2. Next, an insulating material layer is formed blanketly on the substrate 100. Then, a planarization step is performed on the insulating material layer to form the insulating layer 22 in the cell region R1. In some embodiments, a top surface of the insulating layer 22 in the cell region R1 is coplanar with a top surface of the capping layer 20 in the peripheral region R2. A material of the capping layer 20 may be, for example, silicon nitride. The material of the insulating layer 22 may be, for example, silicon oxide. Next, the capping layer 20, the stop layer 18, and the capping layer 10b in the peripheral region R2 are removed. Then, the insulating layer 22 and the capping layer 20 in the cell region R1 and the protective layer 130b and 130c in the peripheral region R2 are etched to form the insulating layer 22a and the capping layer 20a in the cell region R1, and the protective layer 130b and 130c in the peripheral region R2 are removed. In other words, only the protective layer 130a leaves in the peripheral region R2. The etching process is, for example, reactive ion etching. The etching process is, for example, reactive ion etching. The first process is thus completed.

In the first process described above, some steps of forming a device in the cell region R1 belong to a higher temperature process.

Figure 1F:
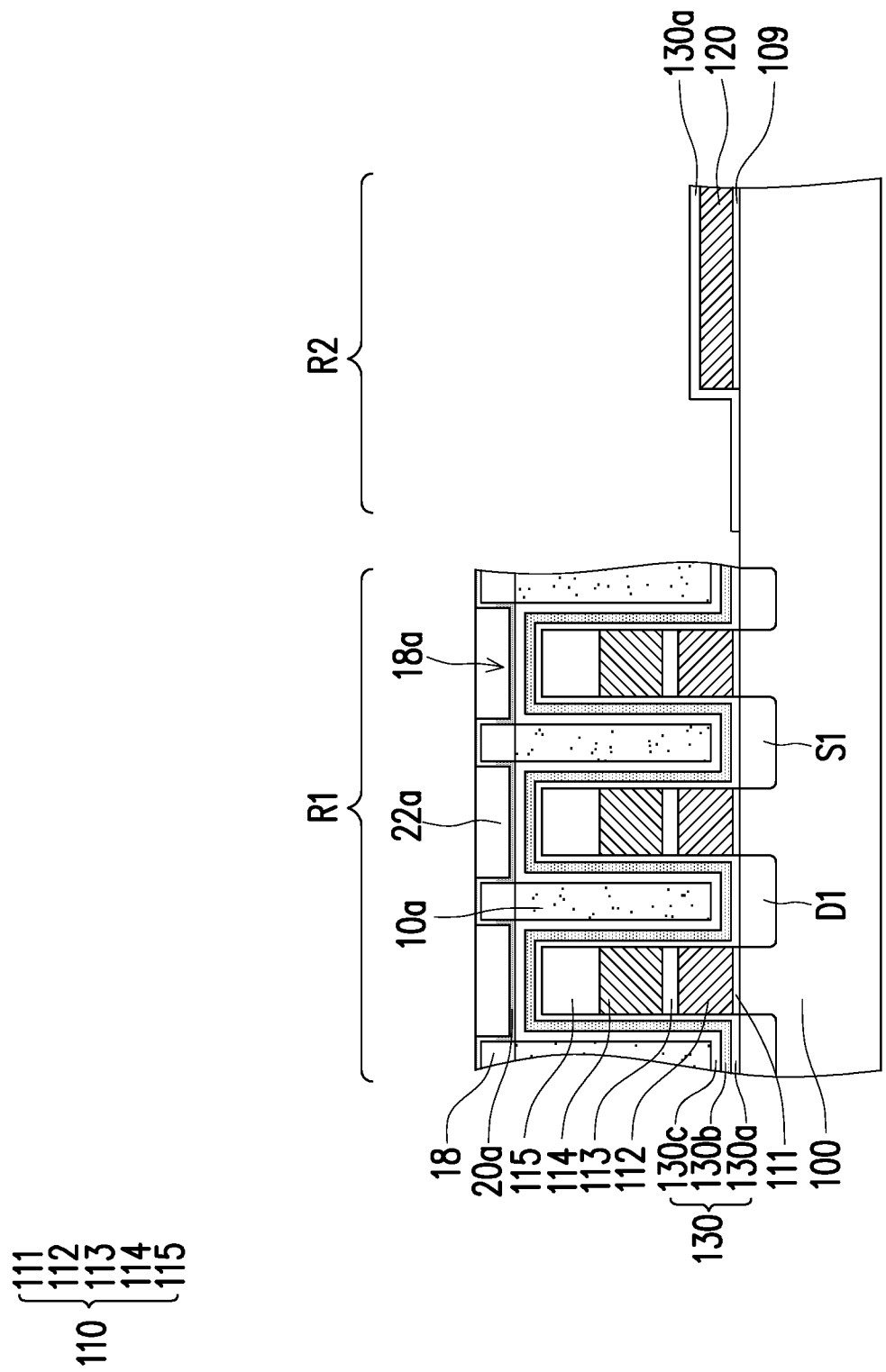
Figure 1G:
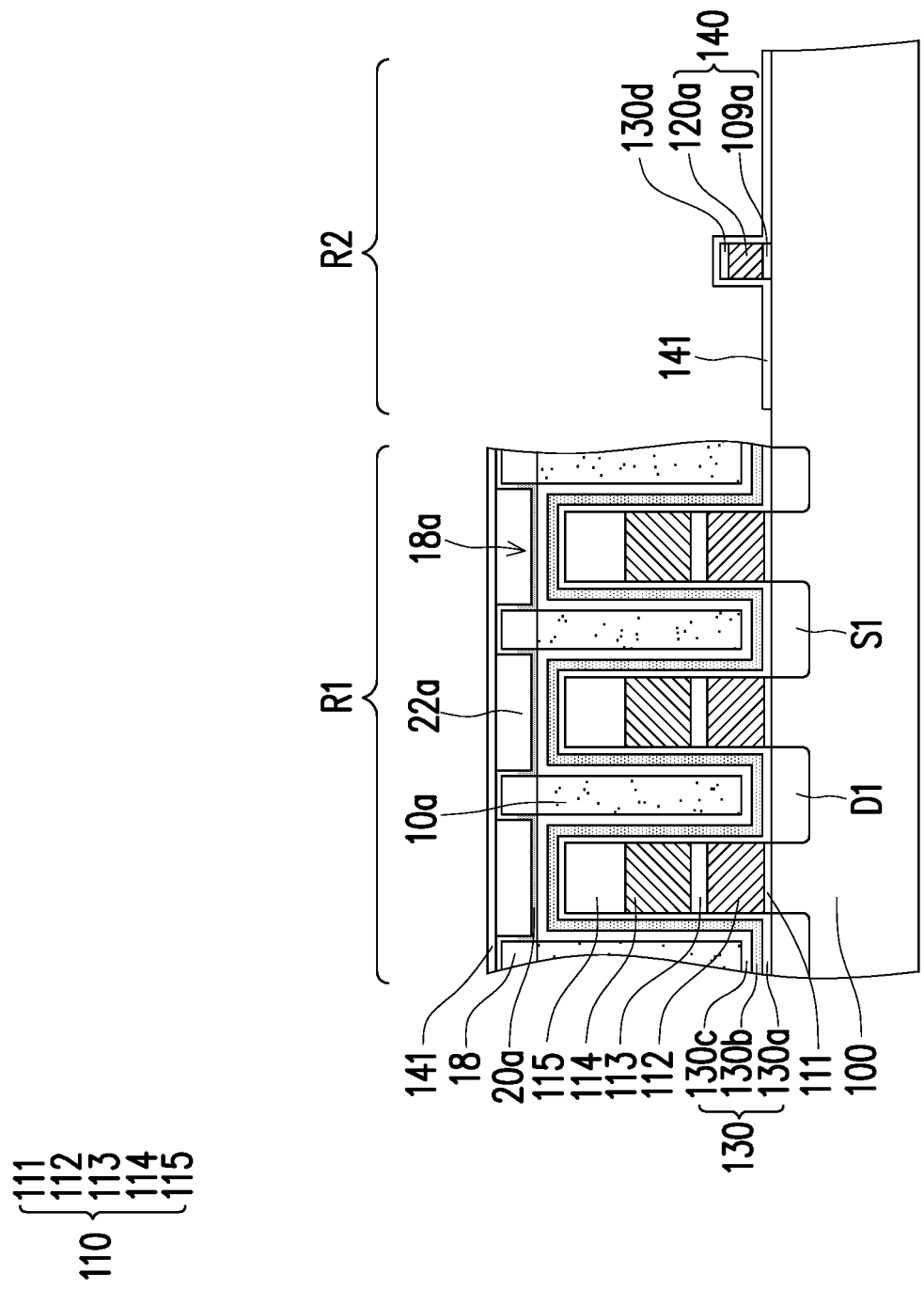

Referring to FIG. 1F and FIG. 1G, after the first process is performed, the second process is performed. The second process is, for example, a logic process, but the invention is not limited thereto. The second process may include the following steps.

First, the protective layer 130a, the conductive layer 120, and the gate dielectric material layer 109 are patterned to form a second gate structure 140. The second gate structure 140 includes a patterned gate dielectric material layer 109a and a patterned conductive layer 120a.

Next, referring to FIG. 1G, a capping layer 141 is blanketly formed on the substrate 100. The capping layer 141 is conformally formed on the second gate structure 140 in the peripheral region R2 and covers the insulating layer 22a and the capping layer 20a in the cell region R1. The material of the capping layer 141 is, for example, silicon oxide. The formation method of the capping layer 141 is, for example, an in-situ steam generation (ISSG) process.

Figure 1H:
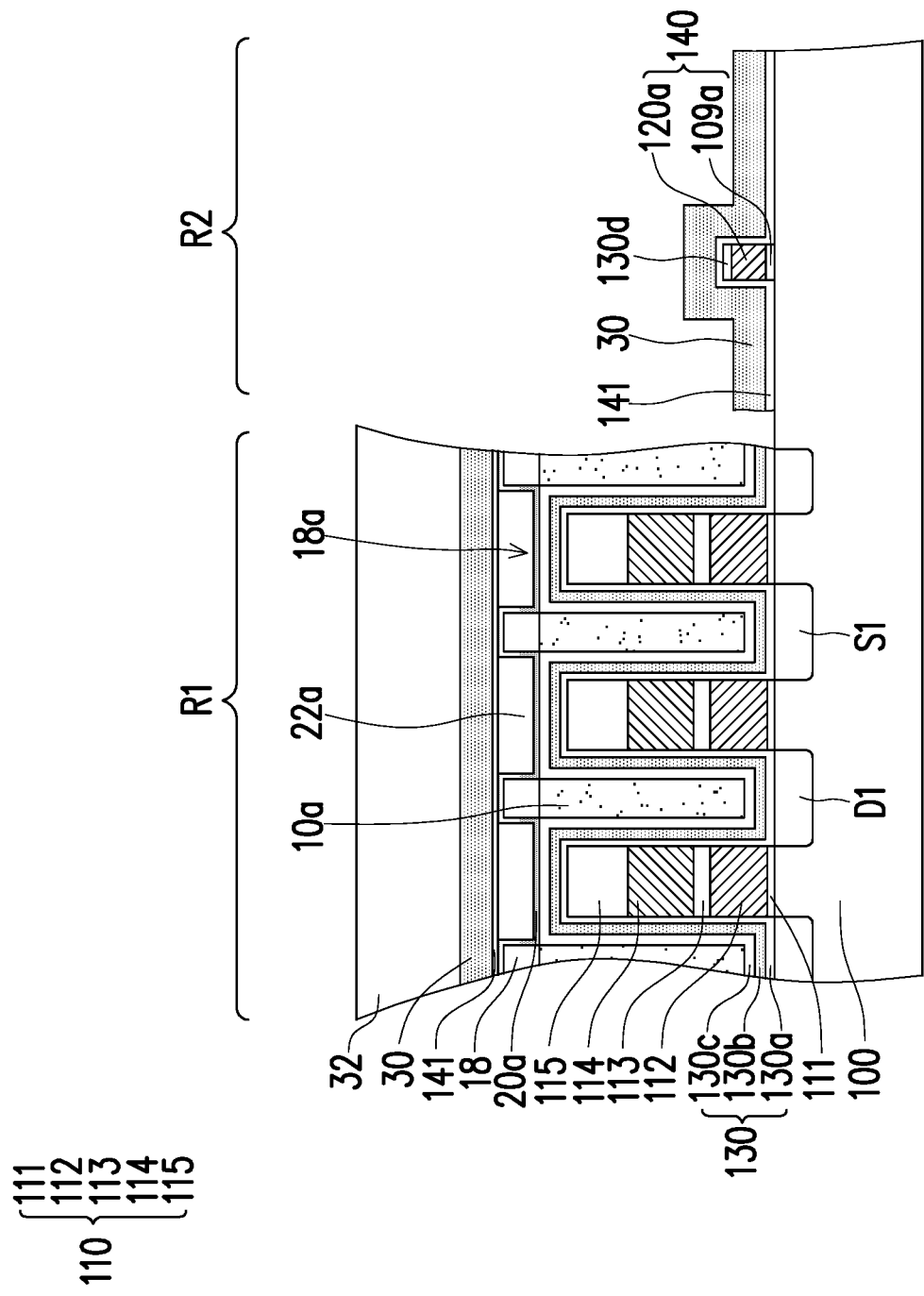

Referring to FIG. 1H, a spacer material layer 30 is blanketly formed on the substrate 100. A material of the spacer material layer 30 includes silicon nitride or silicon oxide, and the formation method is, for example, chemical vapor deposition. The spacer material layer 30 may be a single layer or a plurality of layers. Thereafter, a mask layer 32 is formed on the substrate 100 in the cell region R1 to expose the spacer material layer 30 in the peripheral region R2. The mask layer 32 is, for example, a patterned photoresist layer.

Figure 1I:
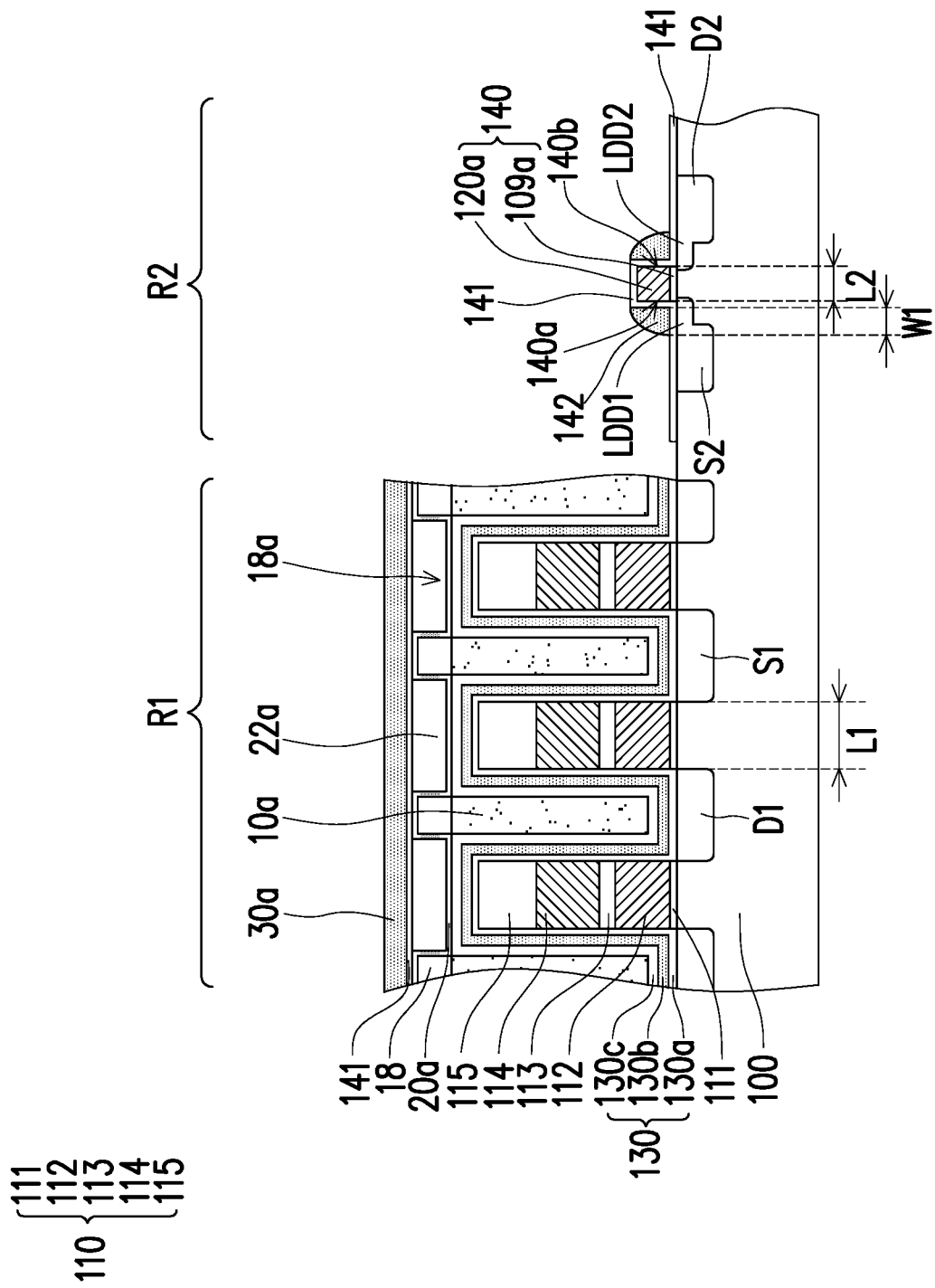

Referring to FIG. 1H and FIG. 1I simultaneously, an anisotropic etching process is performed with the mask layer 32 as an etching mask to etch the spacer material layer 30, so that a spacer material layer 30a is left in the cell region R1, and a spacer 142 is formed on the sidewall of the second gate structure 140 in the peripheral region R2.

Referring to FIG. 1I, after the spacer 142 is formed, doping regions are formed in the substrate 100 in the peripheral region R2. The doped regions include a source region S2 at a first side 140a of the second gate structure 140, and a drain region D2 at a second side 140b of the second gate structure 140 with respect to the first side 140a. The source region S2 and the drain region D2 may be formed by an ion implantation process. The source region S2 and the drain region D2 are, for example, N-type or P-type doped regions, depending on the design of the device.

In this embodiment, at least one ion implantation step may be further performed before the step of forming the spacer 142 so as to form a first lightly doped region LDD1 and a second lightly doped region LDD2 in a substrate 100 at both sides of the second gate structure 140. The doping type of the first lightly doped region LDD1 and the second lightly doped region LDD2 may be the same as the doping type of the source region S2 and the drain region D2. In other words, the source region S2, the drain region D2, the first lightly doped region LDD1, and the second lightly doped region LDD2 may all be N-type doped regions, or both may be P-type doped regions.

In the present invention, since the first process has completed most of the high temperature process, the diffusion of the source region S2 and the drain region D2 may be more effectively controlled during the process performed on the peripheral region R2. Therefore, the gate in the peripheral region R2 does not need to increase the length due to the diffusion of the source region and the drain region. Therefore, the gate may be formed to have a smaller gate length, thereby reducing the device size of the integrated circuit in the peripheral region R2. In the present embodiment, a gate length L2 of the second gate structure 140 is smaller than a gate length L1 of the first gate structure 110. In an embodiment, a ratio of the gate length L2 of the second gate structure 140 to the gate length L1 of the first gate structure 110 is, for example, 0.4 to 0.6.

Figure 1J:
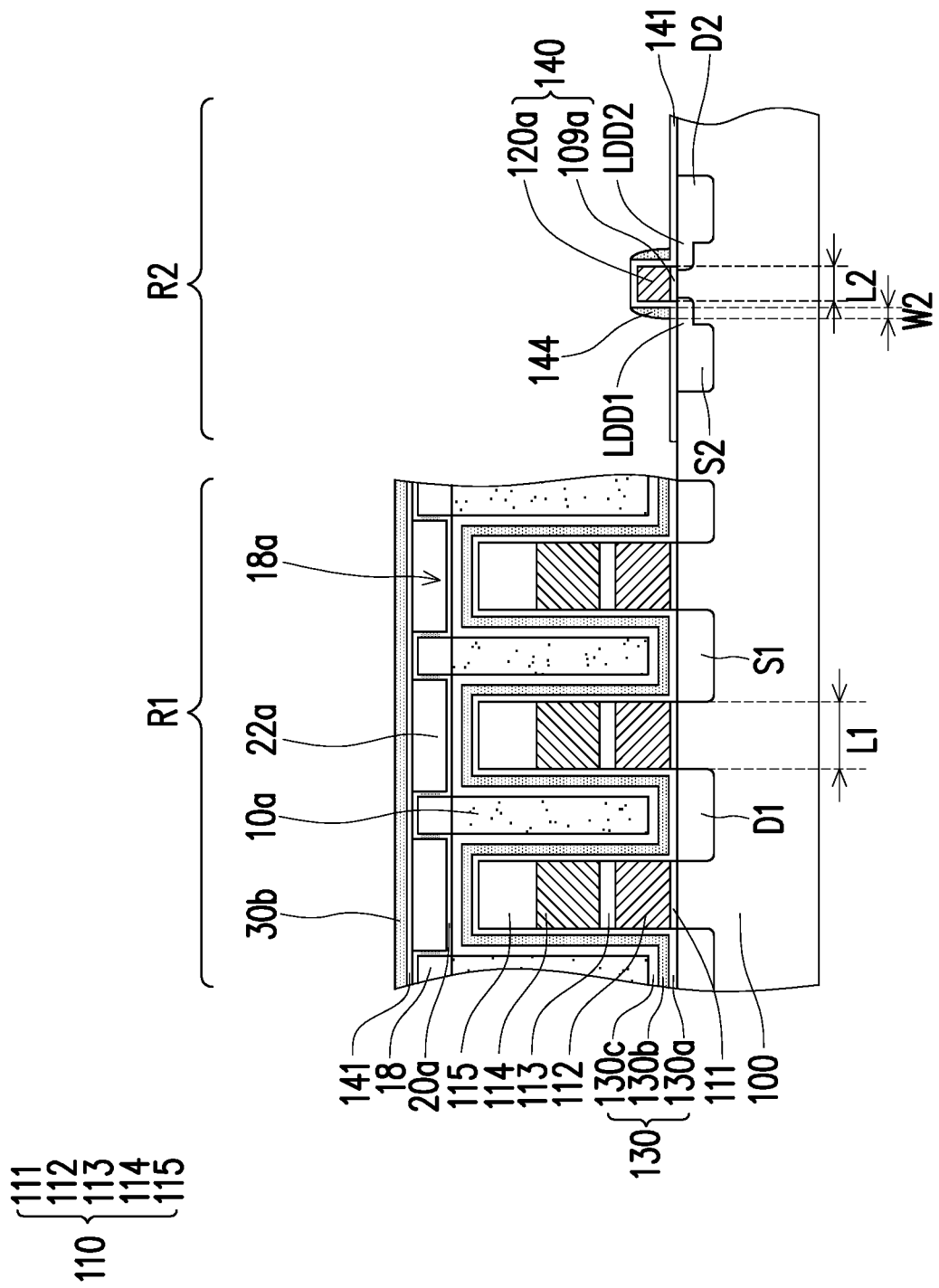

Referring to FIG. 1J, the spacer material layer 30a and the spacer 142 on the substrate 100 of the cell region R1 are subjected to a pull-back process to leave a spacer material layer 30b in the cell region R1 and form spacers 144 on the sidewall of the second gate structure 140 in the peripheral region R2. The pull-back process is performed to reduce the thickness of the spacer 142. In some embodiments, the spacer 142 is first spacer and spacer 144 is second spacer, for example. A width W1 of the spacer 142 is larger than a width W2 of the spacer 144, so the area of the subsequently formed metal silicide layer 150 may be increased, thereby further reducing the resistance of device in the peripheral region R2. In an embodiment, the width W2 of the spacer 144 may be ½ of the width W1 of the spacer 142. The method of forming the spacer 144 is not limited to the above. In other embodiments, the spacer 142 may be completely removed, and another spacer may be further formed.

Figure 1K:
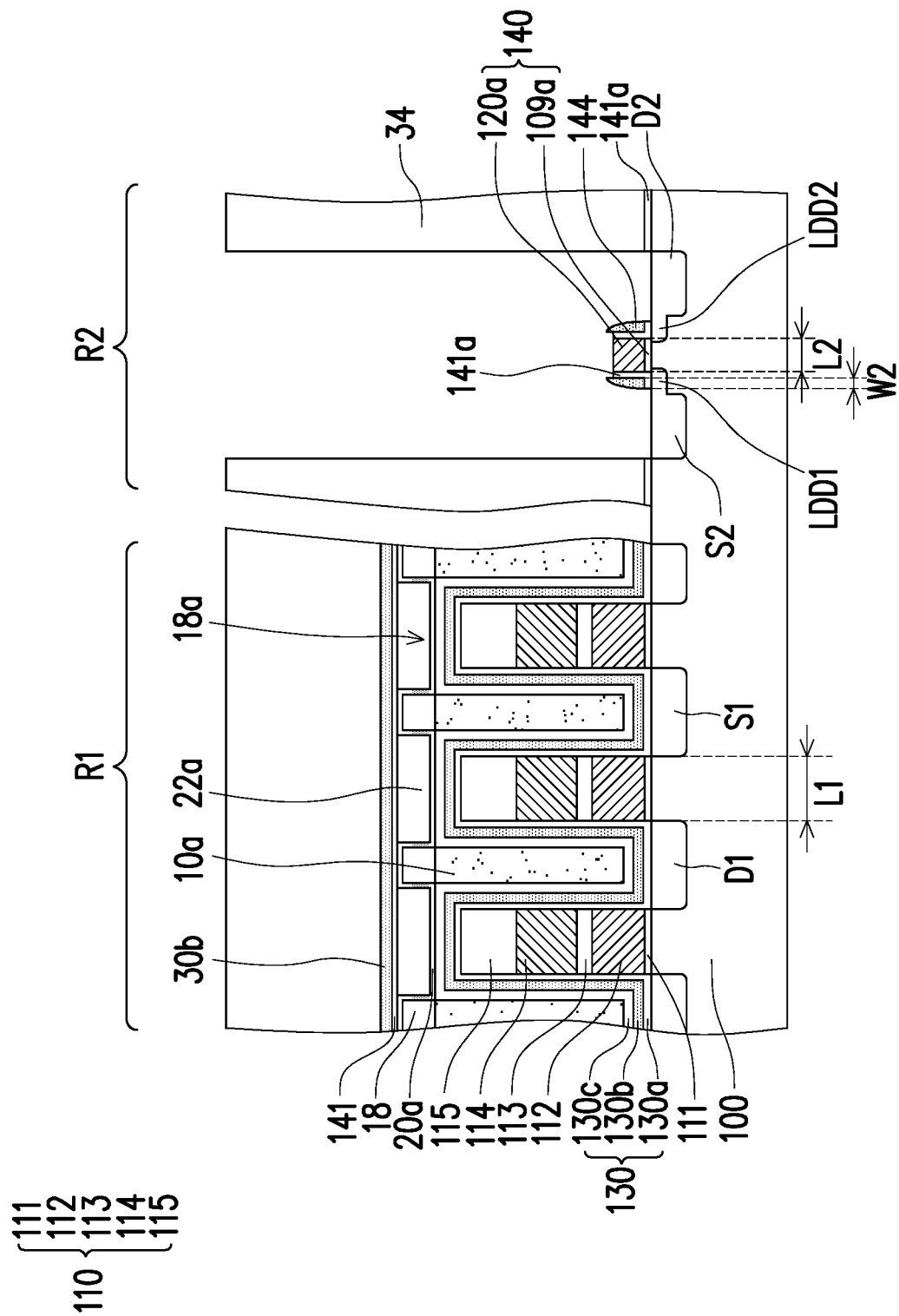

Referring to FIG. 1K, after the spacer 144 is formed, a mask layer 34 is formed on the substrate 100. The mask layer 34 is, for example, a patterned photoresist layer. An opening of the mask layer 34 exposes the capping layer 141 on the source region S2 and the drain region D2 and the capping layer 141 on the second gate structure 140 in the peripheral region R2. Then, using the mask layer 34 as an etch mask, a portion of the capping layer 141 on the substrate 100 in the peripheral region R2 is etched to form a capping layer 141a. The capping layer 141a exposes regions where a metal silicide layer 150 (FIG. 1L) is subsequently formed. In this embodiment, the capping layer 141a exposes an upper region of the second gate structure 140, an upper region of the source region S2, and an upper region of the drain region D2, and even exposes a portion of the first lightly doped region LDD1 and second lightly doped region LDD2.

Figure 1L:
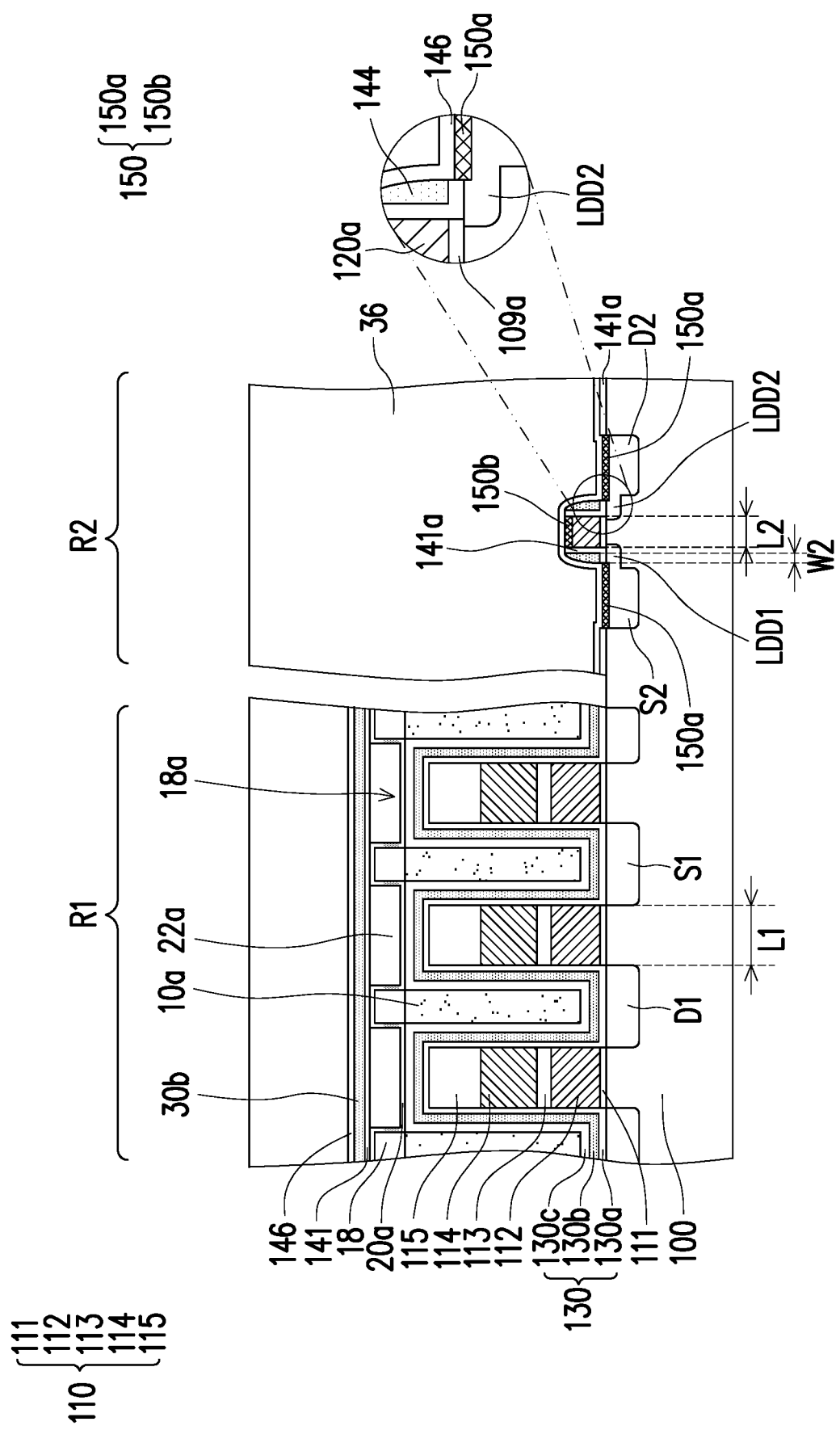

Thereafter, referring to FIG. 1K and FIG. 1L, the mask layer 34 is removed. Next, the metal silicide layer 150 is formed. The metal silicide layer 150 includes metal silicide layers 150a and a metal silicide layer 150b. The metal silicide layers 150a are formed on the source region S2 and the drain region D2 of the substrate 100 not covered by the capping layer 141a. The metal silicide layer 150b is formed on the second gate structure 140. In some embodiments, the regions of the metal silicide layer 150a projected on the substrate 100 overlaps and are identical to the regions of the source region S2 and the drain region D2 projected on the substrate 100. In other embodiments, the regions of the metal silicide layer 150a projected on the substrate 100 overlap with the regions of the source region S2, the drain region D2, a portion of the first lightly doped region LDD1 and the second lightly doped region LDD2 projected on the substrate 100.

The second process is completed. In an embodiment, the highest temperature of the first process may be higher than the highest temperature in the second process. In one embodiment, the maximum temperature of the second process described above may be less than 550° C. In this embodiment, since most of the high temperature process is completed in the first process, and the second process is mostly a relatively low temperature process, there is no excessive heat accumulated on the substrate 100 in the peripheral region R2. In some embodiments, the thermal budget in the cell region R1 is greater than the thermal budget in the peripheral region R2. The process of the embodiment of the present invention may reduce the thermal budget of the second process and avoid excessive diffusion of the source region S2 and the drain region D2. Therefore, the gate region having a smaller gate length may be formed in the peripheral region R2, thereby device size of the integrated circuit in the peripheral region R2 may be reduced.

Referring to FIG. 1L, after the second process is performed, a stop layer 146 and a dielectric material layer 36 are blanketly formed on the substrate 100, as shown in FIG. 1L. The material of the stop layer 146 is, for example, a dielectric material. The material of the stop layer 146 is different from the material of the dielectric material layer 36. In one embodiment, the material of the stop layer 146 is, for example, silicon nitride, and the material of the dielectric material layer 36 is, for example, silicon oxide.

Figure 1M:
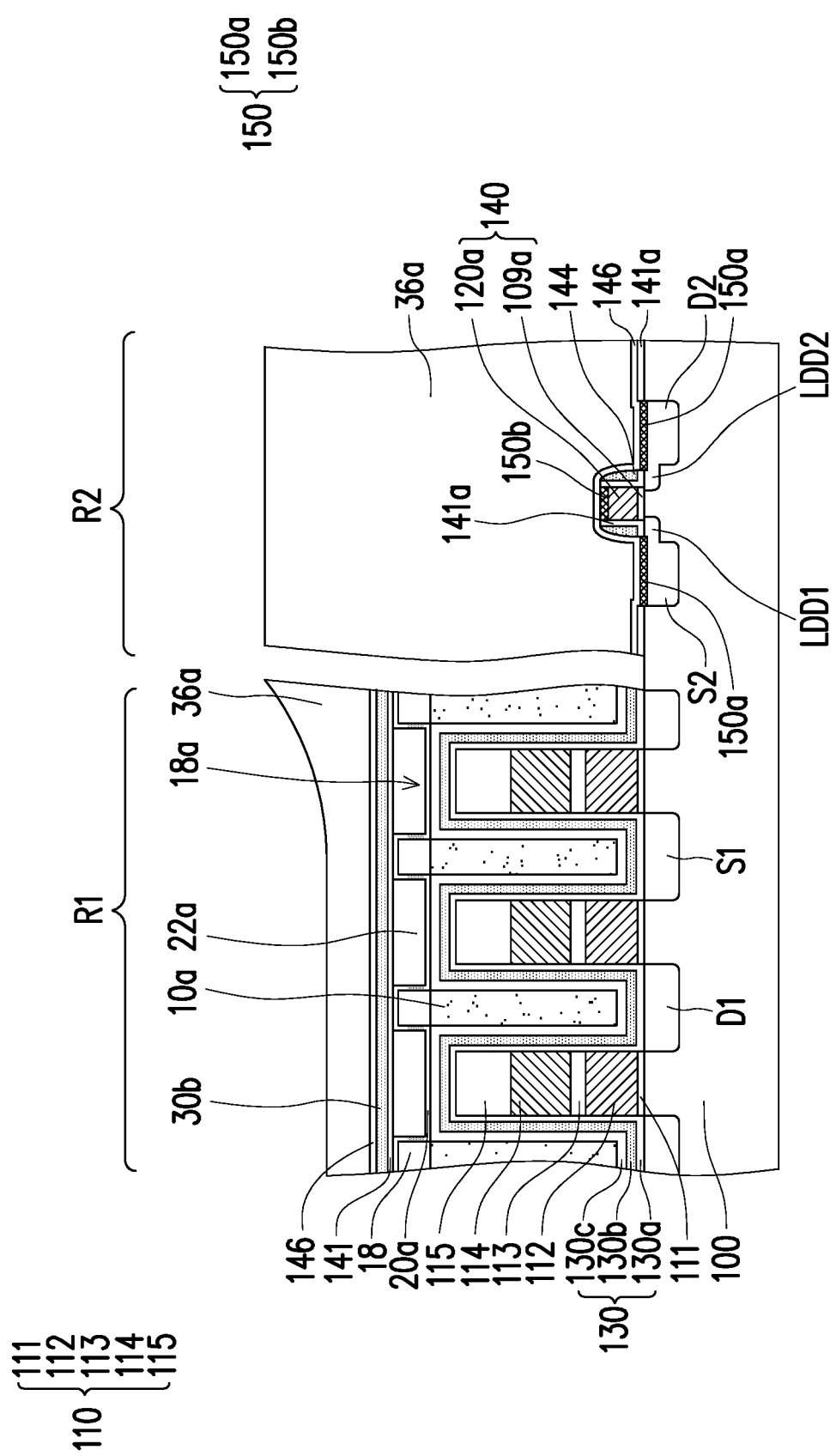

Referring to FIG. 1M, the cell region R1 and the peripheral region R2 have different device densities. The device in the cell region R1 has a higher density and a slower polishing rate, and the device in the peripheral region R2 has a lower density and a faster polishing rate. The present invention first removes a portion of the dielectric material layer 36 on the cell region R1, and the thickness of the dielectric material layer 36a becomes thinner, so as to reduce the load effect after the planarization process. In other words, the height of the portion of the dielectric material layer 36a above the first gate structure 110 in the cell region R1 is lower than the height of the dielectric material layer 36a located in the peripheral region R2. The method of removing the portion of the dielectric material layer 36 in the cell region R1 may first forming a mask layer (for example, a patterned photoresist layer) on the substrate 100 to cover the peripheral region R2 and expose the cell region R1, then performing etching and removing the mask layer.

Figure 1N:
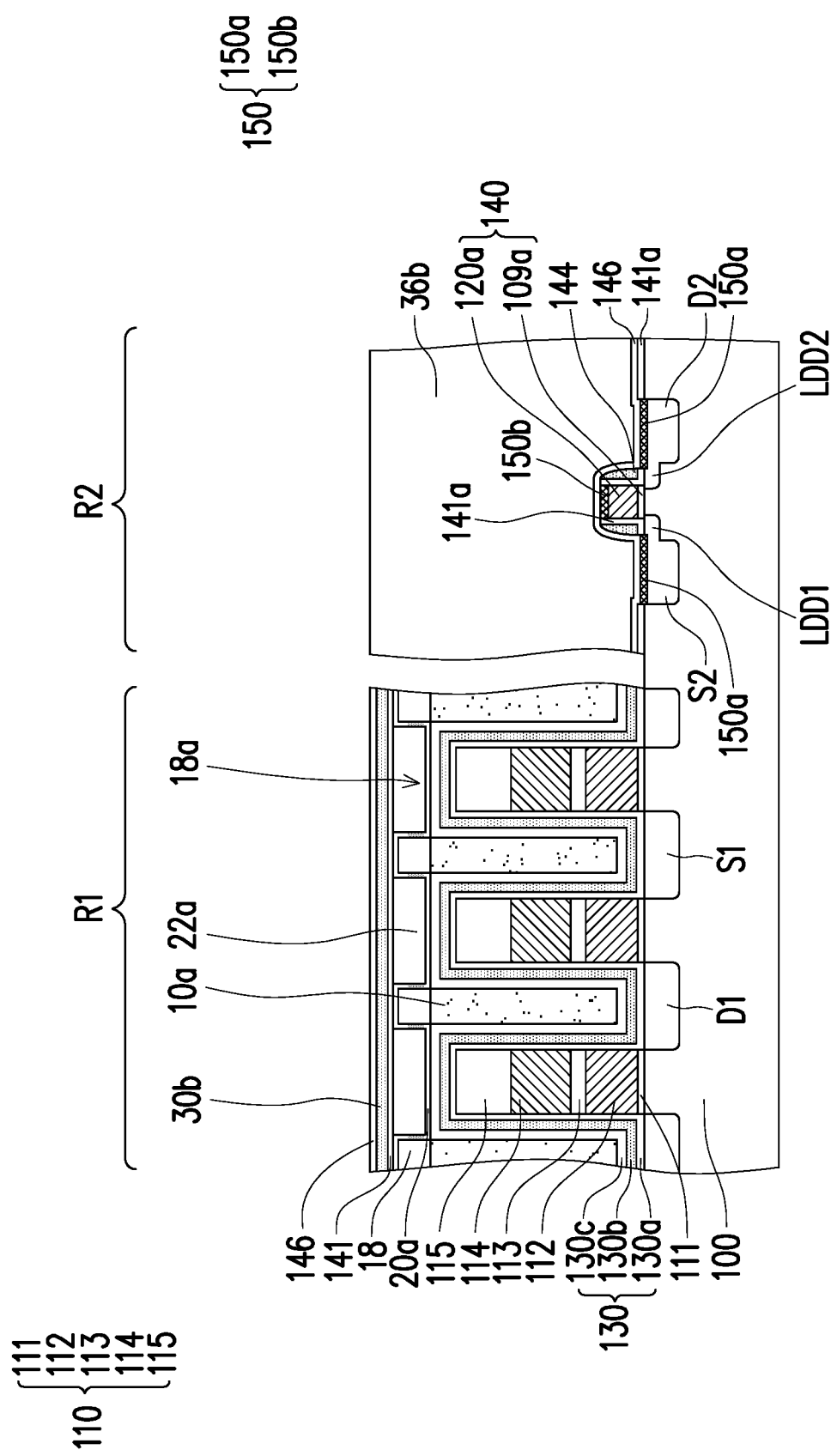
Figure 10:
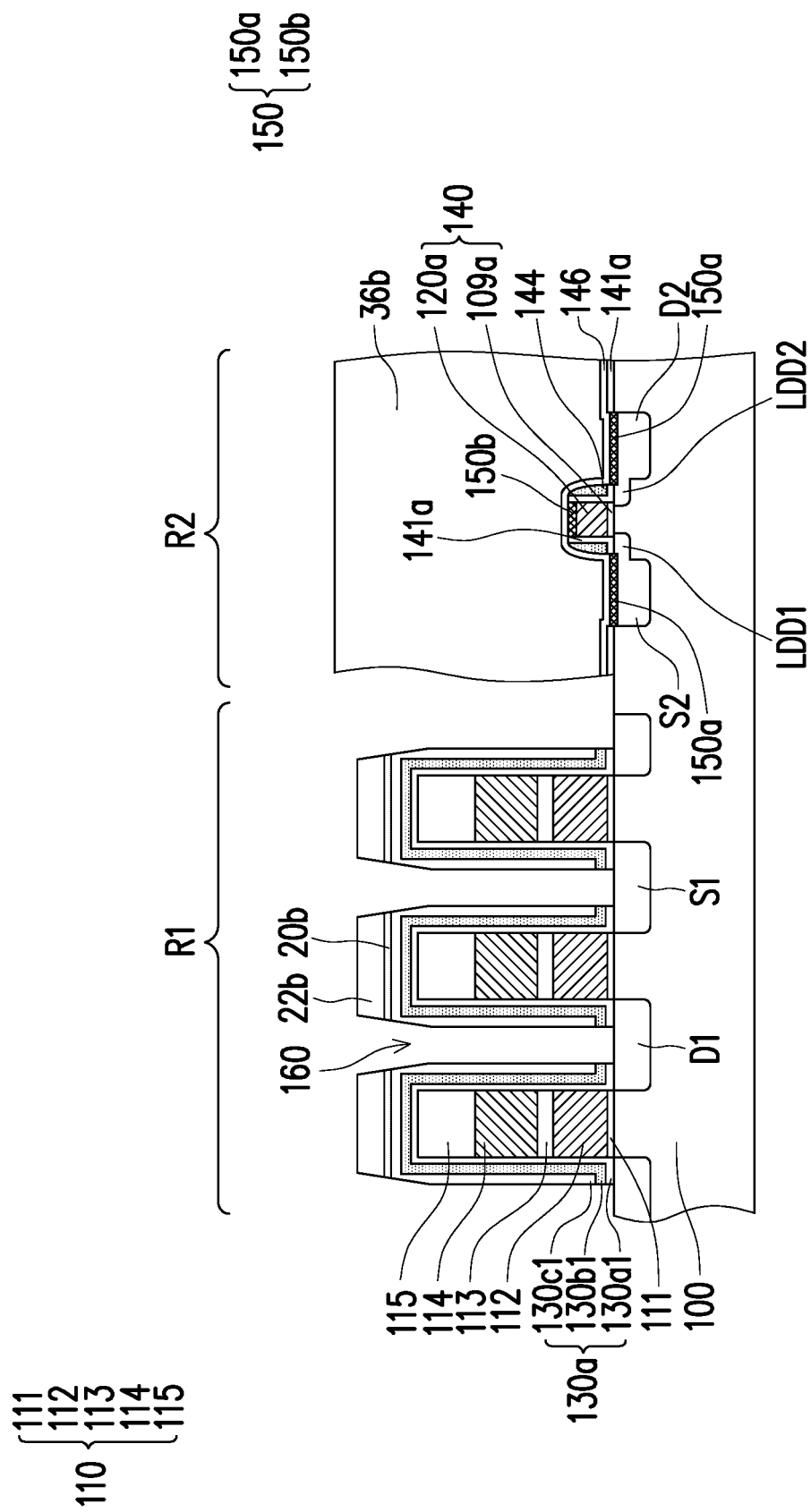

Referring to FIG. 1N, after the dielectric material layer 36a is formed, the dielectric material layer 36a is planarized to form a dielectric layer 36b. The planarization process is, for example, a chemical mechanical polishing process. During the planarization process is performed, the stop layer 146 or the spacer material layer 30b on the cell region R1 may be served as the polishing stop layer. In one embodiment, a top surface of the stop layer 146 on the cell region R1 is coplanar with a top surface of the dielectric layer 36b on the peripheral region R2, as shown in FIG. 1N.

Referring to FIG. 1O, the stop layer 146, the spacer material layer 30b, and the capping layer 141 in the cell region R1 are etched back to expose the insulating layer 22a and the capping layer 20a. Next, with the insulating layer 22a and the dielectric layer 36b as a mask, the capping layer 20a, the stop layer 18, and the underlying dummy plug 10a in the cell region R1 are removed. Then, a portion of the insulating layer 22a, a portion of the capping layer 20a and a portion of the protective layer 130 under the portion of the insulating layer 22a are removed to form an insulating layer 22b, a capping layer 20b, and a protective layer 130a formed by the protective layers 130a1, 130b1, and 130c1, and an inclined sidewall is formed above the first gate structure 110. Then, the protective layer 130a at the bottom of the dummy plug 10a is removed to form a second opening 160 exposing the substrate 100. Since the dummy plug 10a has been previously formed in the gap between the first gates intended to form the contact plug, the formed second opening 160 may be self-aligned to the position of a contact plug to be formed after the dummy plug 10a is removed.

Figure 1P:
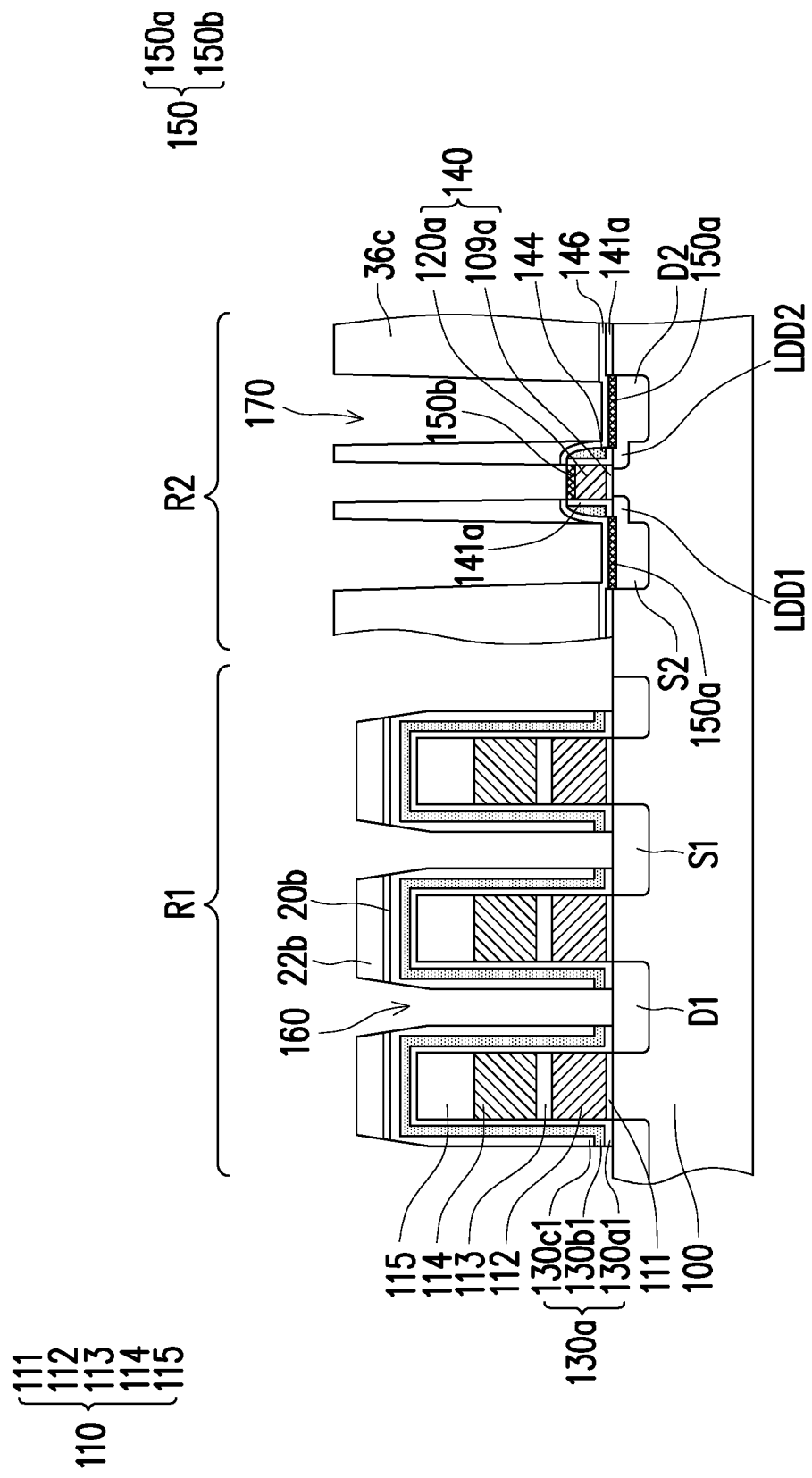

Referring to FIG. 1P, after the second opening 160 is formed, a plurality of third openings 170 are formed in the dielectric layer 36c in the peripheral region R2. A third opening 170 (for example, a contact opening) exposes the metal silicide layers 150a and 150b. The step of forming the third opening 170 is, for example, a carbon layer and an oxynitride layer are blanketly formed on the substrate 100, and a patterned photoresist layer (not shown) is formed on the substrate 100. Next, the oxynitride layer, the carbon layer and the dielectric layer 36b are etched with the patterned photoresist layer as an etching mask to form a dielectric layer 36c having a plurality of third openings 170 in the peripheral region R2.

Figure 1Q:
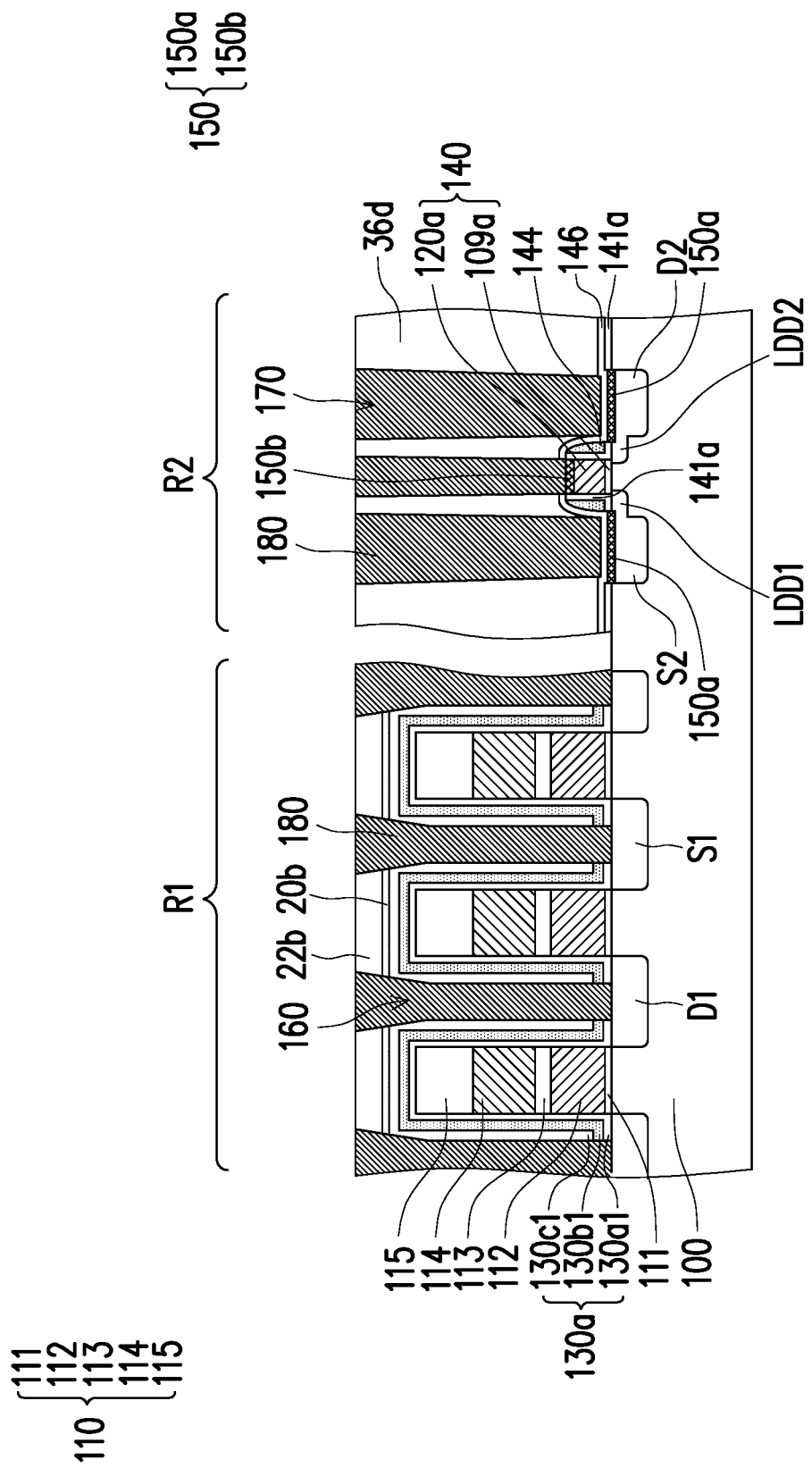

Referring to FIG. 1Q, after the third openings 170 are formed, a plurality of conductive plugs 180 are formed in the second openings 160 and the third openings 170. In some embodiments, the step of forming the conductive plug 180 is as follows. A metal material layer is blanketly formed on the substrate 100. The metal material layer is filled up the second opening 160 and the third opening 170 to form a conductive plug 180. Next, the conductive plug 180 is planarized to form a dielectric layer 36d such that a top surface of the conductive plug 180 is coplanar with a top surface of the dielectric layer 36d.

Since the protective layer 130 is conformally formed on the first gate structure 110, a conductive plug 180 formed in the first opening 116 may have a larger contact area. The aspect ratio of the conductive plug 180 may range from 8 to 9.5, where the aspect ratio is defined as a ratio of the height of the top surface of the conductive plug 180 to the surface of the substrate 100 to the width of the bottom surface of the conductive plug 180.

In summary, the protective layer is formed on the first gate structures and covers the top surfaces and the sidewalls of the first gate structures, so that the protect layer can protect the first gate structures from being interfered by the mobile ions, prevent the mobile ions from diffusing into the first gate structures, and avoid the device from being damaged. In addition, in the present invention, since the first process has completed most of the high temperature process, the diffusion of the source region and the drain region may be more effectively controlled when the device in the peripheral region is fabricated, and the device in the peripheral region is controlled to have a smaller gate length, and thus the device size of the integrated circuit in the peripheral region may be reduced.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A method of manufacturing an integrated circuit, comprising:
 providing a substrate having a cell region and a peripheral region;
 performing a first process, wherein the first process comprises:
  forming a plurality of first gate structures in the cell region, comprising:
   forming a tunneling dielectric layer on the substrate;
   forming a floating gate on the tunneling dielectric layer;
   forming an inter-gate dielectric layer on the floating gate;
   forming a control gate on the dielectric layer of the gate; and
   forming a top cap layer on the control gate, wherein the control gate is free of metal silicide;
  forming a gate dielectric material layer and forming a conductive layer in the peripheral region; and
  conformally forming a protective layer on the plurality of first gate structures;
 after the first process is performed, a second process is performed, and the second process comprises:
  patterning the gate dielectric material layer in the peripheral region and the conductive layer to form a second gate structure; and
  forming a source region and a drain region on both sides of the second gate structure, respectively,
 wherein a highest temperature of the first process is higher than a highest temperature of the second process.

2. The method of claim 1, wherein the forming the protective layer on the plurality of first gate structures comprises:
 forming a first silicon oxide layer on the top surface and the sidewall of the plurality of first gate structures;
 forming a silicon nitride layer on the first silicon oxide layer; and
 forming a second silicon oxide layer on the silicon nitride layer.

3. The method of claim 1, wherein each of the first gate structures is a gate structure of a flash memory, and the second gate structure is a gate structure of a logic device.

4. The method of claim 1, wherein the forming the gate dielectric material layer and the forming the tunneling dielectric layer are formed in a same deposition process.

5. The method of claim 1, wherein the forming of the conductive layer is between the forming the tunneling dielectric layer on the substrate and the forming the floating gate on the tunneling dielectric layer.

6. The method of claim 1, further comprising:
 forming a plurality of dummy plugs on the protective layer between the plurality of first gate structures in the cell region;
 forming a dielectric layer on the substrate;
 removing the dummy plug and the underlying protective layer to form a plurality of first openings, wherein the plurality of first opening expose a surface of the substrate between the first gate structures;
 forming a plurality of second openings in the dielectric layer in the peripheral region; and
 forming a plurality of conductive plugs in the plurality of first openings and the plurality of second openings.

7. The method of claim 6, further comprising forming a metal silicide layer on the second gate structure, the source region, and the drain region before the forming the dielectric layer.

8. The method of claim 7, wherein steps between the forming the second gate structure to the forming the source region and the forming the metal silicide layer comprises:
 forming a first spacer on the sidewall of the second gate structure;
 forming a plurality of doped regions in the substrate to form the source region and the drain region; and performing a pull-back process on the first spacer to form a second spacer.

9. The method of claim 8, wherein the forming the dielectric layer on the substrate comprises:
forming a dielectric material layer on the substrate, covering the cell region and the peripheral region;
removing the portion of the dielectric material layer in the cell region; and
performing a planarization process on the dielectric material layer.

10. The method of claim 9, further comprising forming a stop layer on the substrate to cover the cell region and the peripheral region before the forming the dielectric material layer on the substrate.

11. The method of claim 10, wherein the planarization process comprises a chemical mechanical polishing process, and the stop layer serves as a polishing stop layer during the performing the chemical mechanical polishing process.

12. An integrated circuit comprising:
a substrate having a cell region and a peripheral region;
a plurality of first gate structures disposed in the cell region;
a conformal protective layer covering a top surface and sidewalls of each of the first gate structures;
a second gate structure disposed in the peripheral region;
a source region and a drain region located in the substrate on both sides of the second gate structure;
a plurality of lightly doped regions located in the substrate between the second gate structure and the source region, and in the substrate between the second gate structure and the drain region;
a metal silicide layer disposed in the substrate in the peripheral region, wherein a projection area of the metal silicide layer on a surface of the substrate partially overlaps a projection area of the lightly doped regions on the surface of the substrate; and
a plurality of conductive plugs, wherein each conductive plug is disposed between two adjacent first gate structures.

13. The integrated circuit of claim 12, wherein each of the plurality of conductive plugs has an aspect ratio ranging from 8 to 9.5.

14. The integrated circuit of claim 12, wherein a gate length of the second gate structure is smaller than a gate length of the first gate structure.

15. The integrated circuit of claim 12, wherein the first gate structure comprises:
a conductive layer; and
a top cap layer on the conductive layer and in direct contact with the conductive layer.

16. The integrated circuit of claim 15, wherein the conductive layer is free of metal silicide.

* * * * *